United States Patent [19]

Meany et al.

[11] Patent Number: 5,696,469
[45] Date of Patent: Dec. 9, 1997

[54] CLOCK OSCILLATOR

[75] Inventors: Thomas J. Meany; Patrick R. Hickey, both of Limerick, Ireland

[73] Assignee: Analog Devices, Inc., Norwood, Mass.

[21] Appl. No.: 599,851

[22] Filed: Feb. 12, 1996

[51] Int. Cl.$^6$ ............................................. H03B 5/06
[52] U.S. Cl. ........................... 331/116 R; 331/108 D; 331/161
[58] Field of Search ...................... 331/116 R, 116 FE, 331/161, 159, 108 D

[56] References Cited

U.S. PATENT DOCUMENTS 4,918,408  4/1990  Sakihama et al. ................. 331/116 R
5,453,719  9/1995  Narahara .............................. 331/49

FOREIGN PATENT DOCUMENTS 405218743A  8/1993  Japan ............................... 331/116 R

*Primary Examiner*—Robert Pascal
*Assistant Examiner*—An T. Luu
*Attorney, Agent, or Firm*—Fish & Richardson, P.C.

[57] ABSTRACT

A clock oscillator having a pair of pins adapted for coupling to an external crystal, a first one of such pair of pins being adapted for coupling to an external clock. A switch, formed on the chip, is provided for electrically decoupling the crystal excitation circuit from one of the pair of pins in response to a control signal. In accordance with one embodiment of the invention, the switch is disposed between the output of a crystal excitation circuit and the second one of the pair of output pins and, in another embodiment, the switch is placed in circuit between the input to the crystal excitation circuit and the first one of the pair of pins. In each of these embodiments, when the switch is in a first condition, clock pulses are prevented from being coupled to the second one of the output pins, either: by preventing the external clock from feeding the input to the crystal excitation circuit; or, by preventing the output of the crystal excitation circuit from feeding the second one of the pair of pins. With such an arrangement, when the external clock is used and fed to the first one of the pair of pins, clock pulses are electrically prevented from appearing at the second one of the pair of pins. Therefore, current will not flow from the crystal excitation circuit into any stray capacitance at the second one of the pins.

8 Claims, 3 Drawing Sheets

CLOCK OSCILLATOR

BACKGROUND OF THE INVENTION

This invention relates generally to clock oscillators and more particularly to clock oscillators used in semiconductor integrated circuits.

As is known in the art, clock pulses are used in the operation of many integrated circuits. For example, such clock pulses are typically generated from either a crystal 18 in circuit with a crystal excitation circuit 10, as in FIG. 1, or from an external clock 20, as shown in FIG. 2. The crystal excitation circuit 10 is a gain element to produce positive feedback with a gain greater than one around the crystal 18. The crystal excitation circuit 10 is formed as an integrated part of the integrated circuit on a semiconductor chip 12 and has an input and output connected to clock input and clock output pins CLKIN, CLKOUT, respectively, also provided on the chip 12. The crystal excitation circuit 10, for example, may include a totem pole arrangement of complementary metal oxide silicon (CMOS) transistors 14, 16 arranged as an inverter and a resistor 15 connected between output 19 and the gates, G, as shown. The source electrode S of PMOS transistor 14 is connected to a predetermined potential, here +Vdd, and the source electrode of NMOS transistor 16 is connected to ground, as shown. The feedback, crystal excitation circuit 10, as shown, is, as noted above, used to help initiate oscillation when the crystal 18 is used. The chip 12 also has an external ground terminal 17, as shown. The output 19 of the crystal excitation circuit 10 is fed to other, on-chip circuitry, not shown, formed on the chip 12.

Thus, in one arrangement, the crystal excitation circuit 10 can operate from a crystal 18 connected between the clock input (CLKIN) pin, or terminal, of the chip 12 and the clock output (CLKOUT) pin, or terminal, of the chip 12, as in FIG. 1. In the other arrangement, as shown in FIG. 2, the external clock 20 is used. In the latter arrangement, the external clock 20 is connected between ground and the CLKIN pin of the chip 12, as shown. The output 19 of the crystal excitation circuit 10 is again fed to other on-chip circuits (not shown), as indicated. It is noted, however, that in this later arrangement, the CLKOUT pin is, theoretically, open circuit. However, stray capacitance, $C_{STRAY}$, (shown in phantom in FIG. 2) such as exists between pins in a dual in-line package or between the CLKOUT pin and the grounded chip package, is present. Such stray capacitance, $C_{STRAY}$, may be in the order of 4–5 pf. Thus, for clock frequencies of 2–3 MHZ, with a circuit requiring 200 µA max and a 3.6 volt supply, about 36 µA of current could flow through the stray capacitance, $C_{stray}$. Further, in some applications, functionality testing may be required. In such application, additional circuitry must be connected to the CLKOUT pin. Every effort is made to keep the capacitance from the additional circuitry to a minimum; however, with any practical circuit a significant, undesirable current increase results.

SUMMARY OF THE INVENTION

In accordance with the present invention, a clock oscillator is provided. The clock oscillator includes an integrated circuit chip having formed thereon a crystal excitation circuit. Also formed on the chip is a pair of pins adapted for coupling to an external crystal. A first one of such pair of pins is also adapted for coupling to an external clock. A switch, formed on the chip, is provided for electrically coupling the crystal excitation circuit to the pair of pins in response to a first state of a control signal and for decoupling one of the pair of pins from the crystal excitation circuit in response to a second state of the control.

In accordance with one embodiment of the invention, the switch is disposed between the output of the crystal excitation circuit and the second one of the pair of output pins and, in another embodiment, the switch is placed in circuit between the input to the crystal excitation circuit and the first one of the pair of input pins. In each of these embodiments, when the switch is in the second state, clock pulses are prevented from being coupled to the second one of the output pin either by: preventing the external clock from feeding the input of the crystal excitation circuit; or, decoupling the crystal excitation circuit from the second one of the pair of pins. Therefore, in each one of these embodiments, the switch, in response to the second state of the control signal, electrically prevents clock pulses from appearing at the second one of the pair of pins.

With such an arrangement, when the external clock is used and fed to the first one of the pair of pins, the control signal is placed in the second state and clock pulses are electrically prevented from appearing at the second one of the pair of pins. Therefore, current will not flow from the crystal excitation circuit into any stray capacitance at the second one of the pins. Further, with such arrangement, when a crystal is coupled to the pair of pins, during a normal operating mode (i.e., when the control signal is in the first state), clock pulses are produced for on-chip circuits whereas in a standby mode (i.e., when the control signal is in the second state) clock pulses are prevented from being generated for the on-chip circuits. Thus, power consumption by the clock oscillator and the on chip-circuits is reduced to a very low level during the standby mode.

DESCRIPTION OF THE PREFERRED EMBODIMENTS

Figure 2:
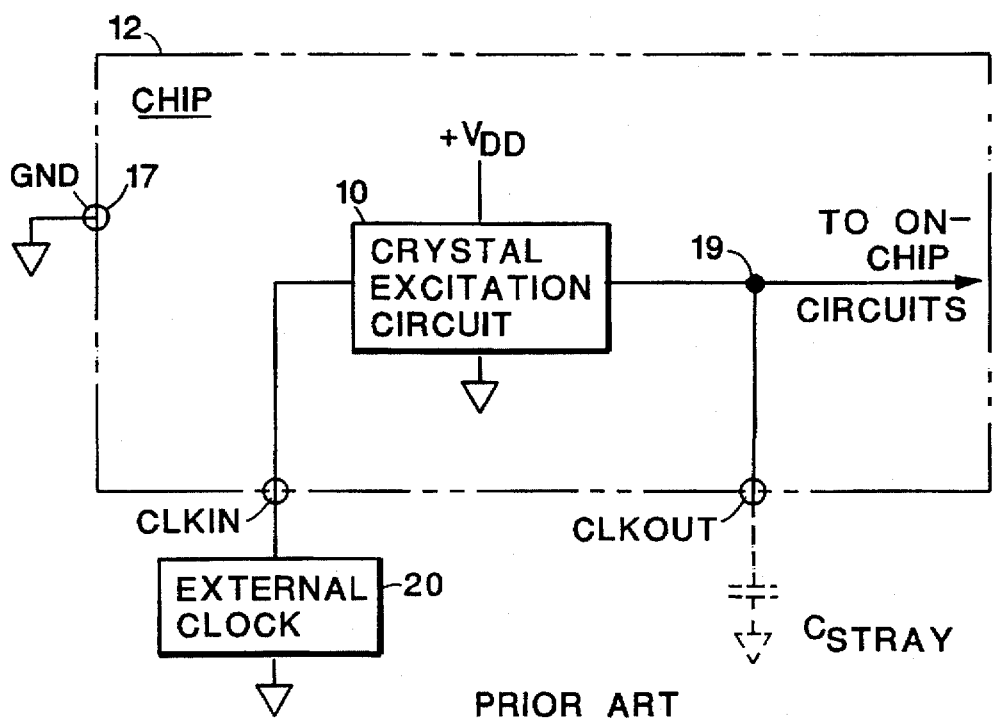
FIG. 2 is an clock oscillator using an external clock, according to the prior art.
Figure 3:
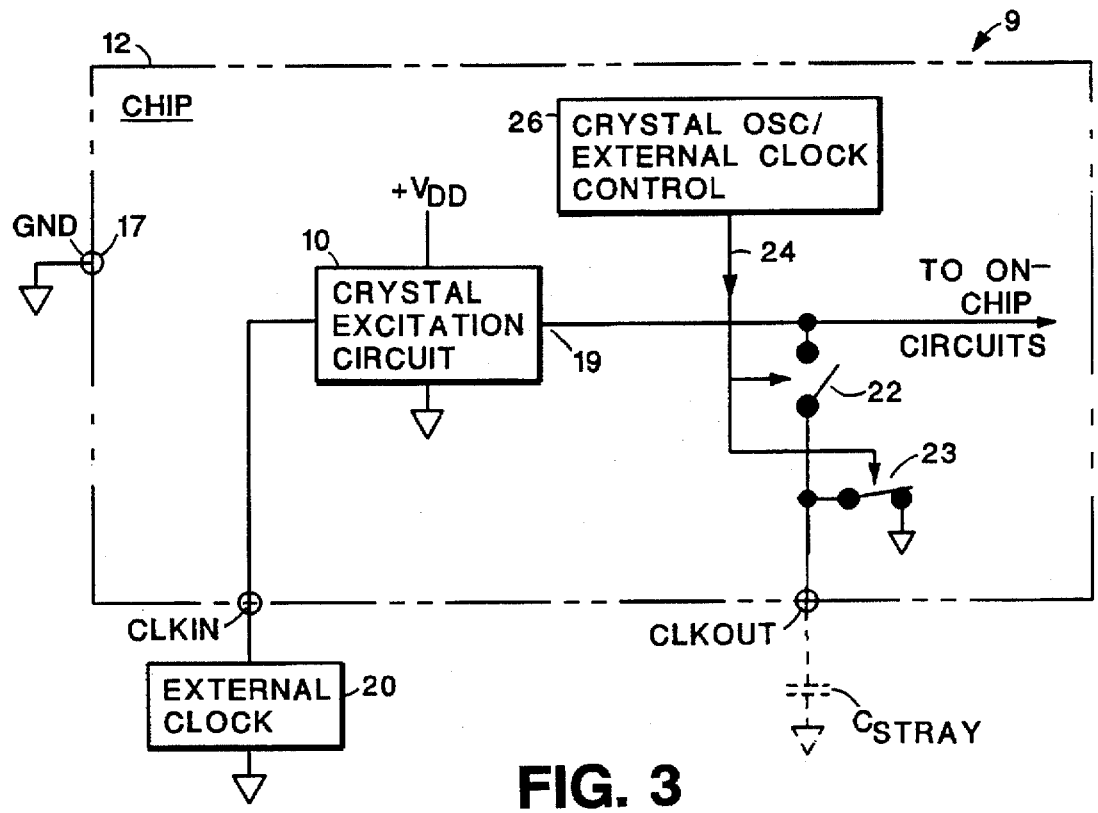
FIG. 3 is a clock oscillator circuit according to the invention.

Referring now to FIG. 3, a clock oscillator 9 is provided. The clock oscillator 9 includes a crystal excitation circuit 10, here the CMOS inverter and feedback circuit shown in FIG. 1. The chip 12 has a ground terminal 17, as shown, and a pair of pins CLKIN and CLKOUT, as described above in connection with FIGS. 1 and 2. A crystal 18, as described in connection with FIG. 1, may be connected between the pair of pins CLKIN and CLKOUT, as described in connection with FIG. 1. On the other hand, an external clock 20 may be connected to pin CLKIN, as shown in FIG. 3 and as discussed in connection with FIG. 2. The output 19 of crystal excitation circuit 10 is fed to on-chip circuitry, not shown, as discussed in connection with FIG. 2. Here, however, a switch 22 is provided between output 19 of the crystal excitation circuit 10 and the CLKOUT pin, as shown. The switch 22 is placed in either an open circuit position, as shown, or closed circuit position, selectively in accordance with a one bit (i.e., binary, logic 1 or logic 0) control signal on line 24. Here, switch 22 is closed when the logic signal on line 24 is 1, i.e. a first logic state and switch 22 is open when the logic signal on line 24 is 0, i.e., a second logic state. The control signal on line 24 is supplied by a crystal/external clock control 26. The control 26 may be set by the user, by other circuitry, not shown, or by such control 26 sensing the presence or absence of the external clock 20 at pin CLKIN, for example. Thus, when an external clock is used, the control 26 places the binary signal on line 24 in a second logic state, here for example logic 0, and switch 22 is placed in an open circuit condition, (i.e., the second state) as indicated. In this open circuit condition, the output 19 of crystal excitation circuit 10 is electrically disconnected from pin CLKOUT. Therefore, current will not pass to any stray capacitance, $C_{STRAY}$, as discussed in connection with FIG. 2. Also included is a second switch 23 also controlled by the binary signal on line 24. Switch 23 is in the closed position in response to the second state condition of the signal on line 24, as shown, when the external clock 20 is coupled to the CLKIN pin so that, rather than having such CLKOUT pin "float", it is coupled to a reference potential, here ground, as shown. Thus, when the binary signal on line 24 is a logic 0, switch 22 is in an open circuit condition, as shown, and switch 23 is in a closed position, as shown. (It should be noted that while here the reference potential connected to the output of switch 23 is ground, alternatively, such switch 23 could have the output thereof connected to $V_{dd}$.)

Figure 1:
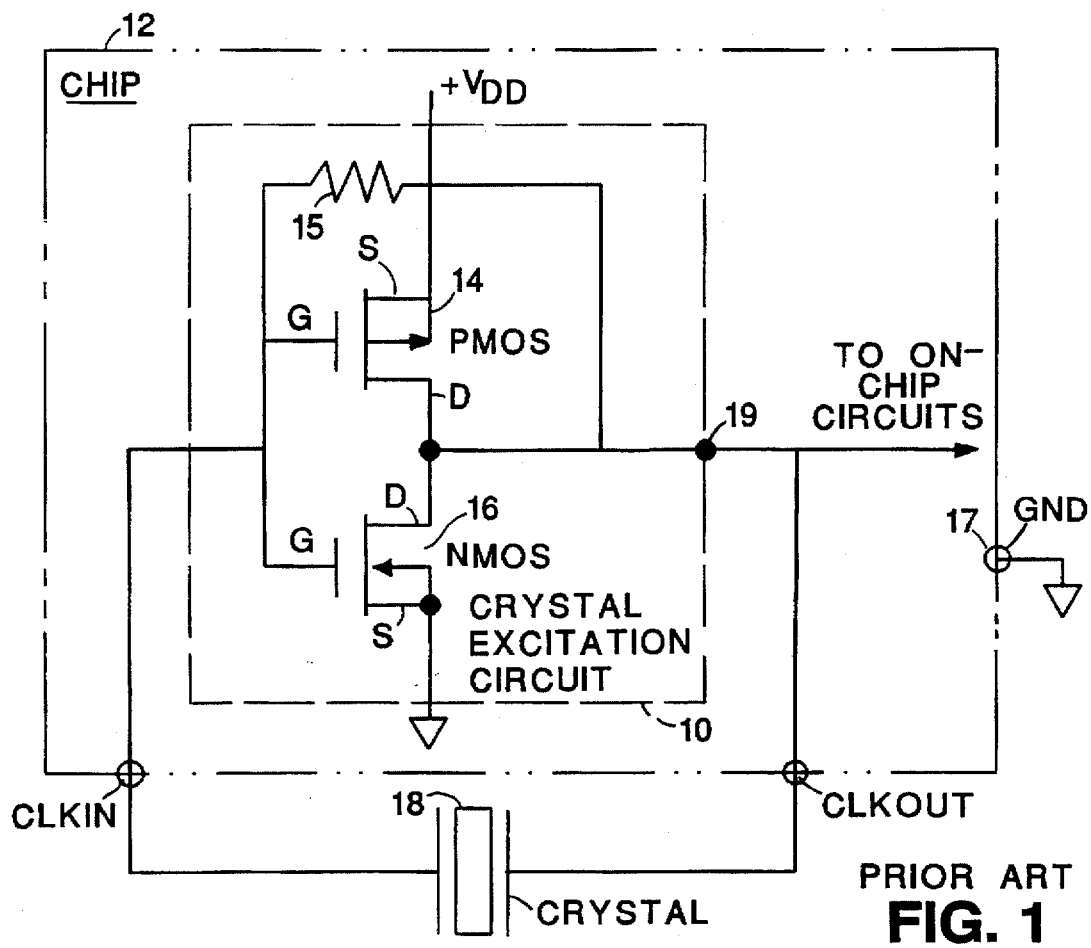
FIG. 1 is a clock oscillator using a crystal oscillator, according to the prior art.

On the other hand, when a crystal, such as crystal 18 described in connection with FIG. 1, is connected between the pins CLKIN and CLKOUT, the control 26 changes the logic state of the signal on line 24 to here a logic 1. Thus, switch 22 is placed in the closed position to electrically connect crystal excitation circuit 10 to the pin CLKOUT and switch 23 is placed in an open circuit condition to remove the reference potential, here ground, connected thereto. Thus, clock pulses are produced at the output 19 of the crystal excitation circuit 10.

Figure 4:
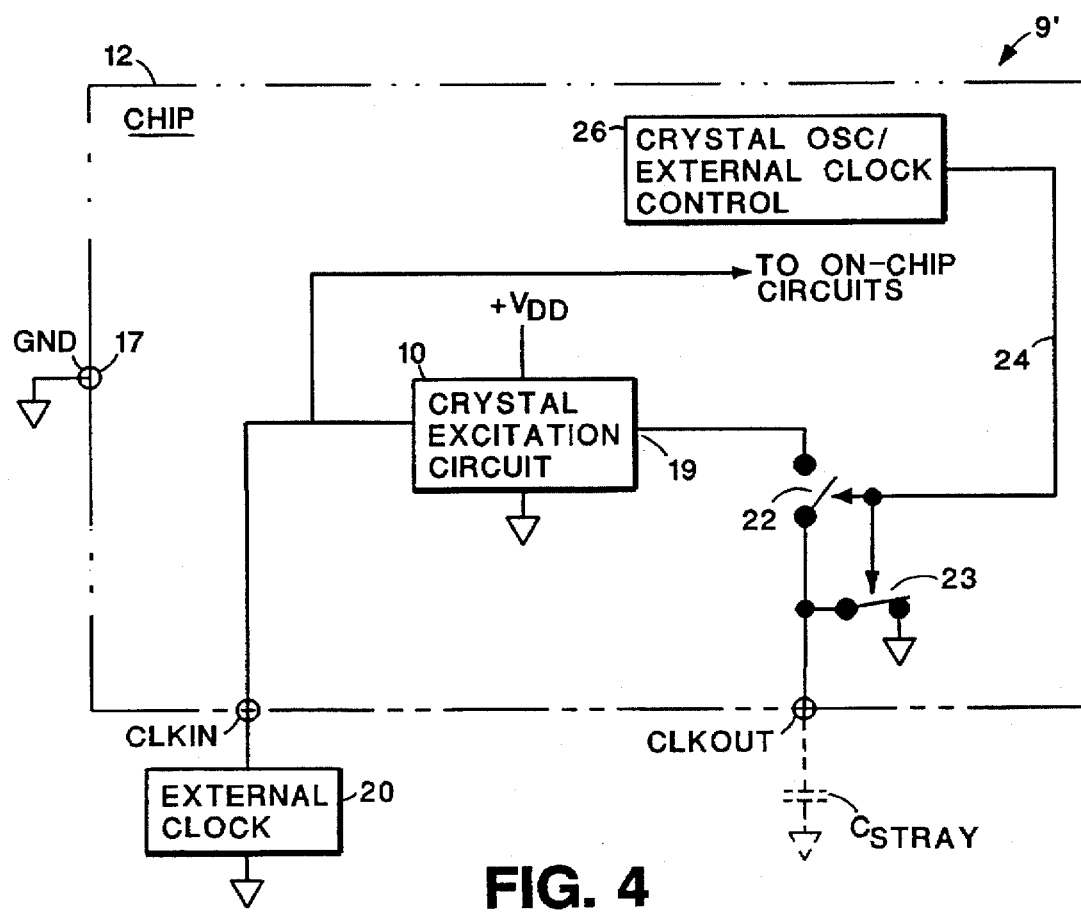
FIG. 4 is a clock oscillator circuit according to an alternative embodiment of the invention.

Referring now to FIG. 4, a clock oscillator 9' is shown. Here the input to the crystal excitation circuit 10 is fed to on-chip circuitry, not shown. Again, the switch 22, under control of control 26, is included to electrically connect crystal excitation circuit 10 to pin CLKOUT when a crystal 18 (FIG. 1) is connected between pins CLKIN and CLKOUT and to electrically disconnect pin CLKOUT from output 19 of crystal excitation circuit 10 when an external clock 20 is connected to pin CLKIN.

Figure 5:
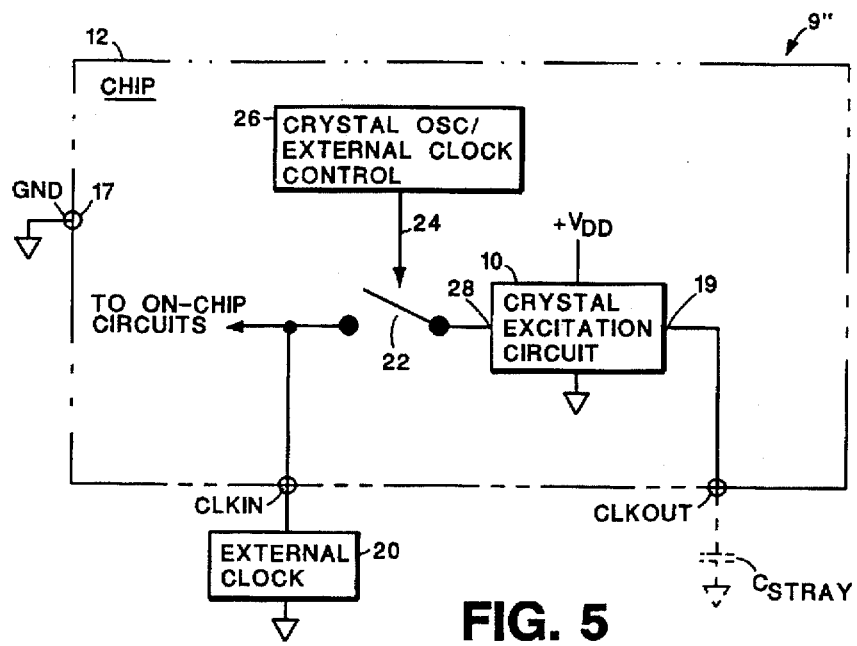
FIG. 5 is a clock oscillator circuit according to another alternative embodiment of the invention.

Referring now to FIG. 5, a clock oscillator 9'' is shown. Here switch 22, under control of control 26, is placed serially between the pin CLKIN and the input 28 to the crystal excitation circuit 10. Thus, when an external clock 20 is connected to pin CLKIN, switch 22 is placed in an open position by control 26 thereby disconnecting the external clock from the input 28 to the crystal excitation circuit 10. Consequently, when switch 22 is in the open position, i.e., when the external clock 20 is connected to pin CLKIN, crystal excitation circuit 10 is disabled. Thus, when crystal excitation circuit 10 is disabled, clock pulses are not produced at the output 19 of crystal excitation circuit 10. More particularly, a constant potential exists at output 19 of the crystal excitation circuit 10 and current will not flow through the stray capacitance $C_{STRAY}$ with such a constant potential at terminal 19.

On the other hand, when a crystal 18 (FIG. 1) is connected between pins CLKIN and CLKOUT, switch 22 is placed in the closed position by control 26. Thus, input 28 of crystal excitation circuit 10 will be fed by the crystal 18.

Figure 6:
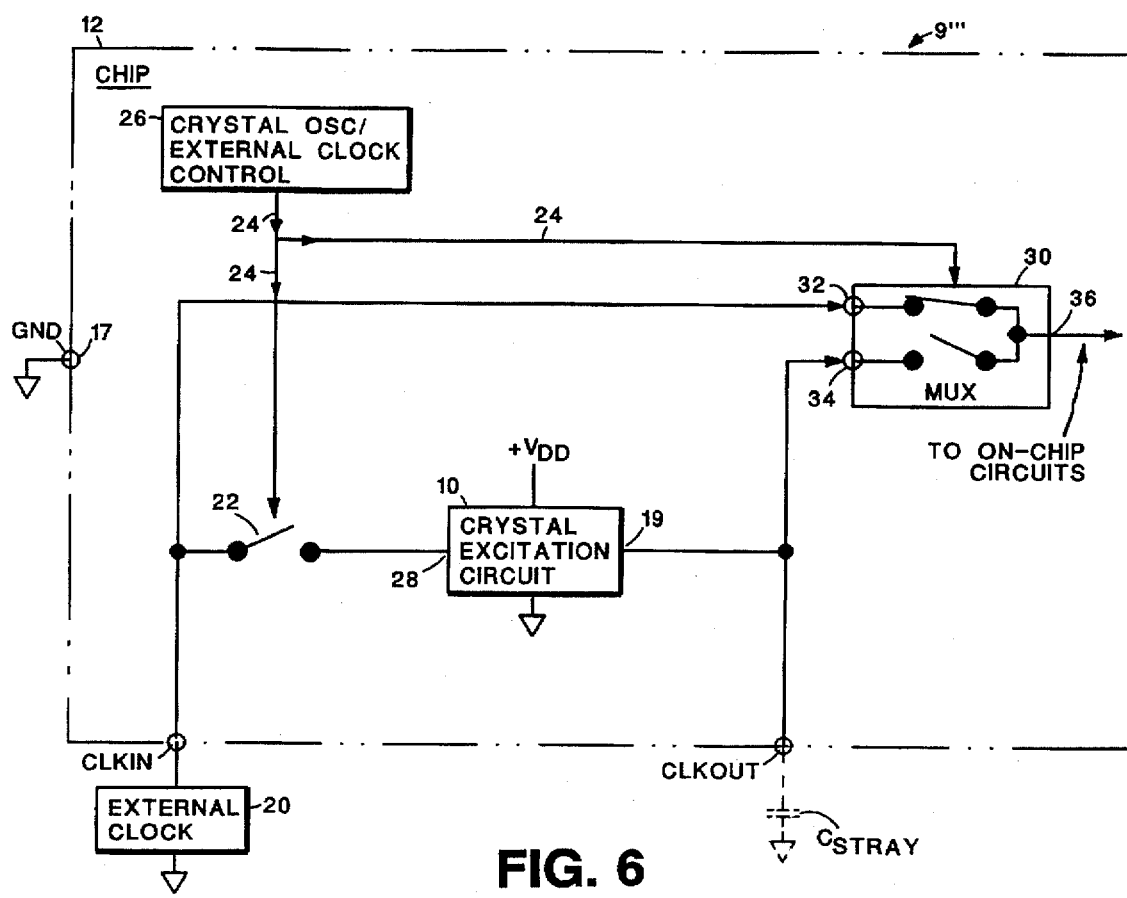
FIG. 6 is a clock oscillator circuit according to an alternative embodiment of the invention.

Referring now to FIG. 6, clock oscillator 9''' is shown. Here switch 22, under control of control 26, is placed serially between the pin CLKIN and the input 28 to the crystal excitation circuit 10. A multiplexer 30 is included. The multiplexer 30 has a pair of inputs 32, 34 and a output 36. Output 36 is coupled to on-chip circuits, not shown. Input 32 is connected to the pin CLKIN and input 34 is connected to output 34 of crystal excitation circuit 10, as shown. The binary control signal produced by crystal/external clock control 26 on line 24 is fed to control switch 22 and is fed to control the multiplexer 30.

When an external clock 20 is connected to pin CLKIN, switch 22 is placed in an open position by control 26 and multiplexer 30 couples input 32 thereof to its output 36 while decoupling input 34 from output 36. Thus, when the external clock 20 is connected to pin CLKIN, switch 22 is placed in the open circuit condition and clock pulses are not produced by the disabled crystal excitation circuit 10. Rather, a constant voltage is produced at the output 19 of the crystal excitation circuit 10. Thus, current will not flow through stray capacitance $C_{STRAY}$. Also the multiplexer 32 decouples the output 19 from its output 36 and therefore from the on-chip circuits. The clock pulses produced by the external clock 20 will, however, pass from pin CLKIN to output 36 of multiplexer 30 for the on-chip circuits, not shown, as indicated.

Further, with such arrangement, when a crystal is coupled to the pair of pins, during a normal operating mode (i.e., when the control signal is in the first state), clock pulses are produced for on-chip circuits whereas in a standby mode (i.e., when the control signal is in the second state) clock pulses are prevented from being generated for the on-chip circuits. Thus, power consumption by the clock oscillator and the on-chip circuits is reduced to a very low level during the standby mode.

On the other hand, when a crystal 18 (FIG. 1) is connected between pins CLKIN and CLKOUT, switch 22 is placed in the closed position by control 26 to connect pin CLKIN to the input of crystal excitation circuit 10 and the multiplexer 30 will, in response to the binary control signal on line 24, couple the clock pulses produced at output 19 to the on-chip circuits, not shown, as indicated. It is noted that here, when the crystal 18 is used, the crystal excitation circuit 10 output 19 is fed to the on-chip circuits, not shown. In this way, a buffering effect is provided by the crystal excitation circuit 10 for the clock oscillator.

Other embodiments are within the spirit and scope of the appended claims.

What is claimed is:

1. A clock oscillator, comprising:
   an integrated circuit chip having formed thereon:
   a crystal excitation circuit having an input and an output;
   a pair of pins adapted for coupling to an external crystal, a first one of such pair of pins being adapted for coupling to an external clock; and,
   a switch, coupled serially between the pair of pins through the crystal excitation circuit, for electrically coupling the crystal excitation circuit between the pair of pins in response to a first state of a control signal with the external clock being electrically coupled to the input of the crystal excitation circuit and for decoupling the crystal excitation circuit from between the pair of pins in response to a second state of the control signal.

2. The clock oscillator recited in claim 1 wherein the switch is disposed between the output of the crystal excitation circuit and the second one of the pair of pins.

3. The clock oscillator recited in claim 1 wherein the switch is disposed between the input to the crystal excitation circuit and the first one of the pair of pins.

4. The clock oscillator recited in claim 2 including a second switch in circuit between the second one of the pair of pins and a reference potential.

5. The clock oscillator recited in claim 2 wherein the input to the crystal excitation circuit is adapted for coupling to on-chip circuits.

6. The clock oscillator recited in claim 2 wherein the output of the crystal excitation circuit is adapted for coupling to on-chip circuits.

7. The clock oscillator recited in claim 3 including a multiplexer having a pair of input terminals and an output terminal, such multiplexer being fed by the control signal, a first one the pair of terminals being connected to the first one of the pair of pins and the second one of the pair of terminals being connected to the output of the crystal excitation circuit and the second one of the pair of pins.

8. The clock oscillator recited in claim 7 wherein the switch decouples the first one of the pair of terminals from the input to the crystal excitation circuit in response to the second state of the control signal and couples the first one of the pair of terminals to the crystal excitation circuit in response to the first state of the control signal; and wherein, the multiplexer couples the first one of the pair of terminals thereof to the output of the multiplexer in response to the second state of the control signal and couples the second one of the pair of terminals to the output of the multiplexer in response to the first state of the control signal.

* * * * *

UNITED STATES PATENT AND TRADEMARK OFFICE
CERTIFICATE OF CORRECTION

PATENT NO. : 5,696,469

DATED : December 9, 1997

INVENTOR(S) : Thomas J. Meany; Patrick R. Hickey

It is certified that error appears in the above-identified patent and that said Letters Patent is hereby corrected as shown below:

In Column 3, Line 3, after the word "is" insert --1, i.e. a first logic state and switch 22 is open when the logic signal on line 24 is--.

Signed and Sealed this

First Day of December, 1998

Attest:

BRUCE LEHMAN

Attesting Officer    Commissioner of Patents and Trademarks